US012280978B2

(12) United States Patent
Isobata et al.

(10) Patent No.: US 12,280,978 B2
(45) Date of Patent: Apr. 22, 2025

(54) COMPONENT SUPPLY DEVICE AND COVER TAPE PEELING METHOD

(71) Applicant: Panasonic Intellectual Property Management Co., Ltd., Osaka (JP)

(72) Inventors: Yoshinori Isobata, Fukuoka (JP); Kyourei Ri, Fukuoka (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 212 days.

(21) Appl. No.: 17/754,655

(22) PCT Filed: Oct. 9, 2020

(86) PCT No.: PCT/JP2020/038369
§ 371 (c)(1),
(2) Date: Apr. 8, 2022

(87) PCT Pub. No.: WO2021/070954
PCT Pub. Date: Apr. 15, 2021

(65) Prior Publication Data
US 2023/0271803 A1 Aug. 31, 2023

(30) Foreign Application Priority Data
Oct. 11, 2019 (JP) ................................. 2019-188108

(51) Int. Cl.
*B32B 43/00* (2006.01)
*B65H 20/22* (2006.01)
(Continued)

(52) U.S. Cl.
CPC ........... *B65H 41/00* (2013.01); *B32B 43/006* (2013.01); *B65H 20/22* (2013.01);
(Continued)

(58) Field of Classification Search
CPC ....... B32B 43/006; B65B 69/00; B65H 20/20; B65H 20/22; B65H 35/0026; B65H 41/00;
(Continued)

(56) References Cited

U.S. PATENT DOCUMENTS

| 2015/0047788 A1 | 2/2015 | Kanda et al. |
| 2019/0055101 A1 | 2/2019 | Horie |

FOREIGN PATENT DOCUMENTS

| CN | 104247588 A | 12/2014 |
| JP | 2019-036669 A | 3/2019 |

(Continued)

OTHER PUBLICATIONS

Notification of Reasons for Refusal and Search Report for the Chinese patent application No. 202080066926.4 dated Jul. 12, 2024.

(Continued)

*Primary Examiner* — Michael A Tolin
(74) *Attorney, Agent, or Firm* — MCDONALD HOPKINS LLC (57) ABSTRACT

A component supply device supplies a component accommodated in a carrier tape including a base tape and a cover tape pasted on the base tape and having a length to a forward end thereof that is longer than that of the base tape. The component supply device includes a tape conveying part, a turning over correcting part, and a peeling part. The tape conveying part conveys the carrier tape along a conveyance path. The turning over correcting part moves the forward end of the cover tape folded to a side opposite to a side of a conveyance direction, to a position located ahead of a forward end of the base tape in the conveyance direction in (Continued)

the conveyance path. The peeling part captures the forward end of the cover tape, and peels off the cover tape from the base tape.

11 Claims, 8 Drawing Sheets

(51) Int. Cl.
*B65H 35/00* (2006.01)
*B65H 41/00* (2006.01)
*H05K 13/02* (2006.01)
*H05K 13/04* (2006.01)

(52) U.S. Cl.
CPC ......... *B65H 35/0026* (2013.01); *H05K 13/02* (2013.01); *H05K 13/0419* (2018.08)

(58) Field of Classification Search
CPC .............. H05K 13/02; H05K 13/0417; H05K 13/0419; Y10T 156/11; Y10T 156/1105; Y10T 156/1126; Y10T 156/1137; Y10T 156/1168; Y10T 156/1174; Y10T 156/19; Y10T 156/1906; Y10T 156/1928; Y10T 156/1933; Y10T 156/1939; Y10T 156/195; Y10T 156/1956; Y10T 156/1978; Y10T 156/1989

See application file for complete search history.

(56) References Cited

FOREIGN PATENT DOCUMENTS

WO      2013/132599 A1    9/2013
WO      WO-2018235897 A1 * 12/2018 ............. H05K 13/02

OTHER PUBLICATIONS

International Preliminary Report on Patentability issued in Patent Application No. PCT/JP2020/038369 mailing dated Apr. 21, 2022.
International Search Report issued in Patent Application No. PCT/JP2020/038369 dated Dec. 15, 2020.
Japanese Office Action issued in Japanese Patent Application No. 2021-551730 dated Apr. 4, 2023.

* cited by examiner

COMPONENT SUPPLY DEVICE AND COVER TAPE PEELING METHOD

TECHNICAL FIELD

The present invention relates to a component supply device that supplies a component to a component mounting device and, in particular, to peeling off a cover tape of a carrier tape.

BACKGROUND ART

A tape feeder that pitch-feeds a carrier tape accommodating components and that thereby position a component at a component pickup position for picking up by a component mounting mechanism is heavily used as a component supply device that supplies a component to a component mounting device. The carrier tape has therein a base tape that has recesses each accommodating a component formed thereon and a cover tape that is pasted on an upper face of the base tape to seal up the recesses. In the tape feeder, a tape peeling mechanism to peel off the cover tape to expose each of the components is disposed on the upstream side of the component pickup position in the tape feeding direction (see, e.g., Patent Document 1).

In the prior art described in Patent Document 1, a mechanism that sandwiches a cover tape between a pair of feeding rollers to feed the tape in a peeling direction is known as a configuration of a tape peeling mechanism that automatically peels off a cover tape.

PRIOR ART DOCUMENT

Patent Document

Patent Document 1: Japanese Laid-Open Patent Publication No. 2019-36669

SUMMARY OF THE INVENTION

Problem to be Solved by the Invention

It is important for a tape feeder to reliably capture and peel off a cover tape of a carrier tape loaded therein using a tape peeling mechanism, and the tape feeder needs further improvement.

An object of the present disclosure is to provide a component supply device capable of reliably peeling off a cover tape from a carrier tape loaded therein.

Means for Solving Problem

In order to solve the above problem, according to a first aspect of the present disclosure, there is provided a component supply device that supplies a component accommodated in a carrier tape comprising a base tape and a cover tape pasted on the base tape and having a length to a forward end thereof that is longer than that of the base tape, the component supply device comprising: a tape conveying part that conveys the carrier tape along a conveyance path; a turning over correcting part that moves the forward end of the cover tape folded to a side opposite to a side of a conveyance direction, to a position located ahead of a forward end of the base tape in the conveyance direction in the conveyance path; and a peeling part that captures the forward end of the cover tape, the peeling part peeling off the cover tape from the base tape.

According to another aspect of the present disclosure, there is provided a peeling method for a cover tape of a carrier tape that is conveyed along a conveyance path in a component supply device, wherein the carrier tape comprises: a base tape; and the cover tape that is pasted on the base tape, the cover tape having a length to a forward end thereof that is longer than that of the base tape, and wherein the peeling method for a cover tape comprises the steps of: causing the base tape to travel forward in a conveyance direction; causing the carrier tape after passing through a position of a peeling part that peels off the cover tape in the conveyance path, to travel backward by a predetermined distance; causing the carrier tape caused to travel backward to again travel forward; and capturing the forward end of the cover tape by the peeling part to peel off the cover tape from the base tape.

Effect of the Invention

According to the present invention, a cover tape can reliably be peeled off from a load-in carrier tape.

MODE FOR CARRYING OUT THE INVENTION

The first aspect of the present disclosure provides a component supply device that supplies a component accommodated in a carrier tape comprising a base tape and a cover tape pasted on the base tape and having a length to a forward end thereof that is longer than that of the base tape, the component supply device comprising: a tape conveying part that conveys the carrier tape along a conveyance path; a turning over correcting part that moves the forward end of the cover tape folded to a side opposite to a side of a conveyance direction, to a position located ahead of a forward end of the base tape in the conveyance direction in the conveyance path; and a peeling part that captures the forward end of the cover tape, the peeling part peeling off the cover tape from the base tape.

A second aspect of the present disclosure provides the component supply device according to the first aspect, wherein the turning over correcting part moves the forward end of the cover tape folded to the side opposite to the side of the conveyance direction, to a position located ahead of the forward end of the base tape in the conveyance direction by relative moving of the base tape and the forward end of the cover tape.

A third aspect of the present disclosure provides the component supply device according to the first aspect, wherein the turning over correcting part comprises a contact portion to which the forward end of the cover tape abuts when the carrier tape is conveyed in a backward direction of the conveyance direction.

A fourth aspect of the present disclosure provides the component supply device according to the first aspect, wherein the contact portion is an inner edge of an opening that is disposed in the conveyance path.

A fifth aspect of the present disclosure provides the component supply device according to the fourth aspect, wherein the conveyance path communicates with the peeling part through the opening.

A sixth aspect of the present disclosure provides the component supply device according to any one of the second to fifth aspects, wherein the turning over correcting part comprises a conveyance control part that controls the tape conveying part to convey the carrier tape by a predetermined distance in the backward direction of the conveyance direction to again convey the carrier tape in the conveyance direction.

A seventh aspect of the present disclosure provides the component supply device according to the sixth aspect, wherein the component supply device comprises a tape detecting part that detects the carrier tape conveyed along the conveyance path, and wherein the conveyance control part controls the tape conveying part, based on a result of detection by the tape detecting part, to convey the carrier tape by a predetermined distance in the backward direction of the conveyance direction to again convey the carrier tape in the conveyance direction.

An eighth aspect of the present disclosure provides the component supply device according to any one of the first to seventh aspect, wherein the component supply device comprises an air nozzle that guides the forward end of the cover tape to the peeling part.

A ninth aspect of the present disclosure provides a peeling method for a cover tape of a carrier tape that is conveyed along a conveyance path in a component supply device, the carrier tape including a base tape and the cover tape that is pasted on the base tape, the cover tape having a length to a forward end thereof that is longer than that of the base tape, the peeling method for a cover tape comprising the steps of: causing the base tape to travel forward in a conveyance direction; causing the carrier tape after passing through a position of a peeling part that peels off the cover tape in the conveyance path, to travel backward by a predetermined distance; causing the carrier tape caused to travel backward to again travel forward; and capturing the forward end of the cover tape by the peeling part to peel off the cover tape from the base tape.

A tenth aspect of the present disclosure provides the peeling method for a cover tape according to the ninth aspect, wherein the carrier tape is caused to travel backward in a state where the forward end of the cover tape abuts a contact portion.

An eleventh aspect of the present disclosure provides the peeling method for a cover tape according to the ninth or tenth aspect, comprising the steps of: detecting a forward end of the carrier tape by a tape detecting part; and causing the carrier tape after passing through a position of the peeling part in the conveyance path, to travel backward by a predetermined distance based on a result of detection of the forward end of the carrier tape.

A twelfth aspect of the present disclosure provides the peeling method for a cover tape according to any one of the ninth to eleventh aspects, wherein air is sprayed toward the peeling part and to the forward end of the cover tape caused to again travel forward.

An embodiment of the present disclosure will be described below with reference to the drawings.

The overall configuration of a tape feeder 1 that is a component supply device of a first embodiment will be described with reference to FIG. 1 and FIG. 2. The tape feeder 1 is used being attached to a component mounting device that mounts electronic components onto a substrate, and has a function of supplying components accommodated in a carrier tape 3 (see FIG. 2) each to a component pickup position for picking up by a component mounting mechanism in the component mounting device. A "forward travel" of the carrier tape as used herein means that the carrier tape is conveyed in the downstream direction, and a "backward travel" of the carrier tape means that the carrier tape is conveyed in the upstream direction.

Figure 1:
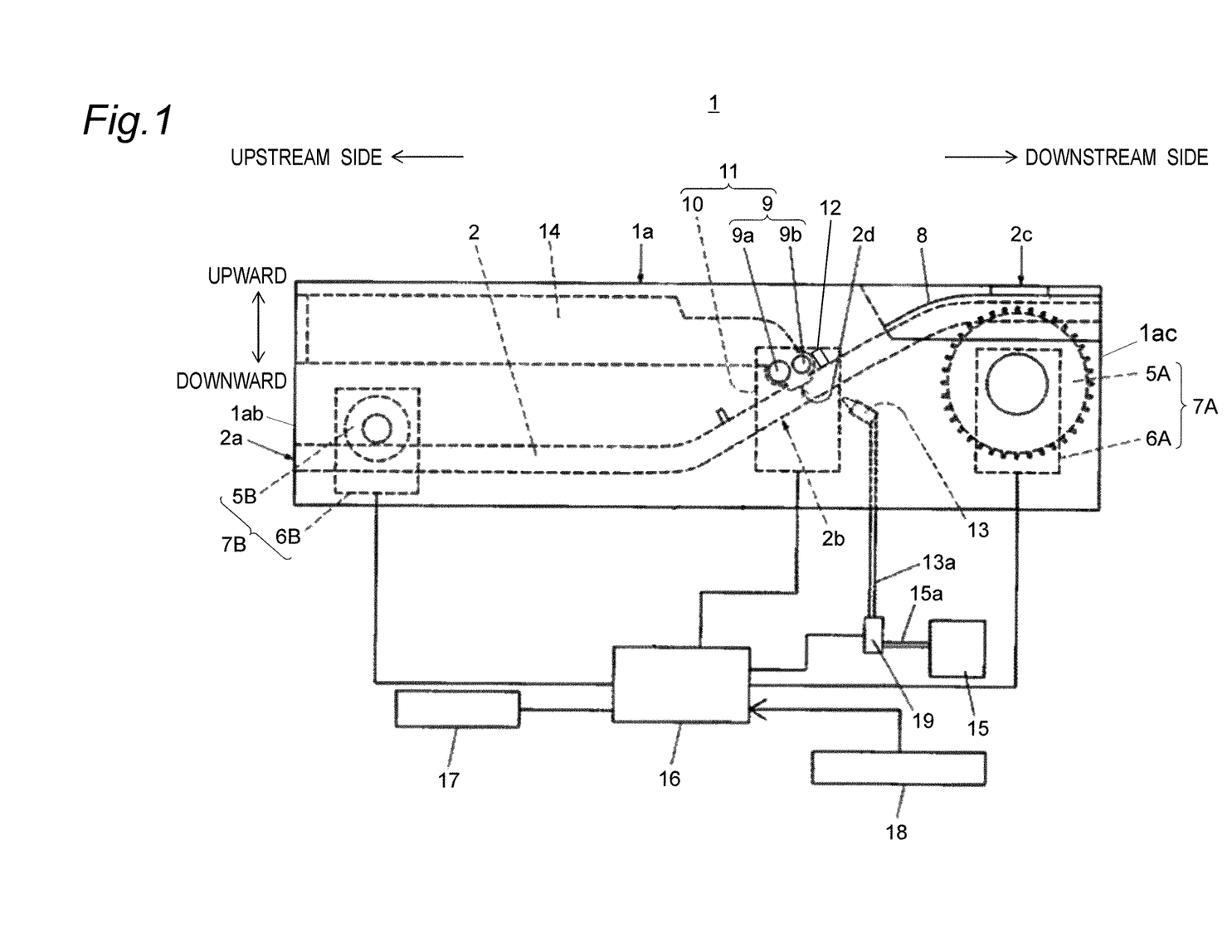
FIG. 1 is an explanatory configuration diagram of a component supply device in Example 1 of one embodiment of the present disclosure.
Figure 2:
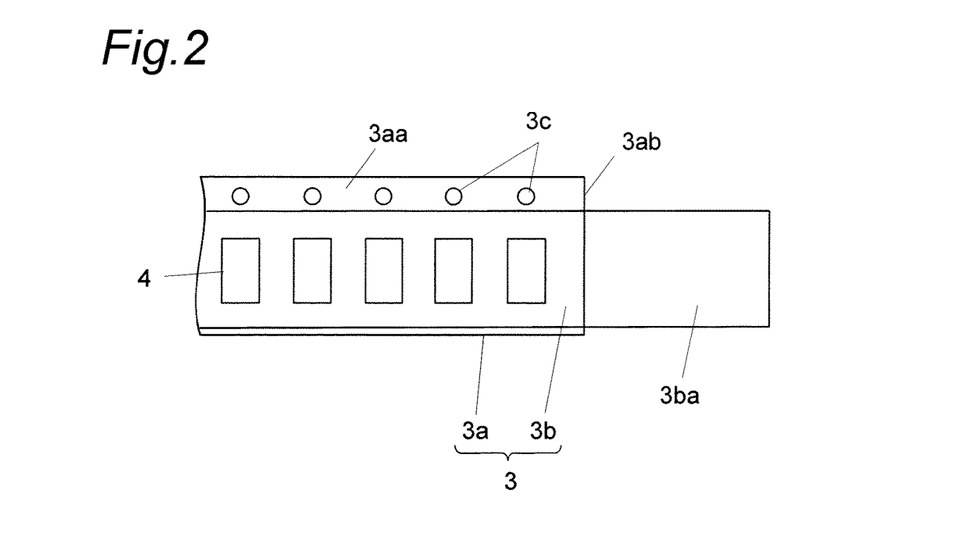
FIG. 2 is a front diagram of a carrier tape.

In FIG. 1, a main body 1a of the tape feeder 1 is a frame part that forms the outer shape of the tape feeder 1. A conveyance path 2 to convey the carrier tape 3 accommodating components to be supplied is disposed along the tape conveyance direction inside the main body 1a. As shown in FIG. 2, the carrier tape 3 has a configuration to have therein a base tape 3a that has accommodating portions 4 disposed thereon to be recesses each accommodating a component and whose upper face is sealed up by a cover tape 3b. A side edge portion 3aa not covered by the cover tape 3b of the carrier tape 3 has feed holes 3c formed at equal intervals to convey the carrier tape 3. The recesses of the accommodating portions 4 may each be referred to as "pocket". The cover tape 3b includes an extending portion 3ba that extends from a forward end 3ab of the base tape 3a. The extending portion 3ba is disposed to cause a peeling part 9 described later to capture the cover tape 3b, and the dimension of the extending portion 3ba from the forward end 3ab of the base tape 3a is set to be a length necessary for the cover tape 3b to be captured by the peeling part 9 after arriving thereat from the conveyance path 2. The cover tape 3b has a film-like shape and is made from a material having extremely low stiffness, and the extending portion 3ba is therefore kept folded at the forward end 3ab of the base tape 3a in the conveyance path 2. The state where the extending portion 3ba is folded at the forward end 3ab of the base tape 3a and a portion of the folded portion overlaps on the carrier tape 3 on the upstream side of the forward end 3ab will be referred to as "turning over" herein. In the overlap state, the extending portion 3ba of the cover tape 3 may or may not contact the cover tape 3b pasted on the upper face of the base tape 3a. "To correct turning over" and "correction of folding" each mean attempting to recover the extending portion 3ba folded at the forward end 3ab of the base tape 3a into the state thereof where the extending portion 3ba is extended ahead of (downstream) the forward end 3ab of the base tape 3a, and each also include the case where the extending portion 3ba of the cover tape 3b is not recovered to be fully extended forward.

The conveyance path 2 opens at a tape inlet 2a that is disposed in a lower portion of a side end face 1ab on the upstream side (on the left in FIG. 1) of the main body 1a, and becomes a slope portion 2b disposed in an obliquely upward direction in an intermediate portion of a main body 1a. On the downstream side of the slope portion 2b, the conveyance path 2 is disposed along an upper face of the main body 1a and opens in a side end face 1ac on the downstream side of the main body 1a. A component pickup position 2c positioned on the upper face of the main body 1a is disposed on the downstream side in the conveyance path 2.

Amounting head of a component mounting mechanism disposed on the component mounting device 18 accesses the component pickup position 2c and the component accommodated in the carrier tape 3 is thereby picked up by the mounting head. In the vicinity of the component pickup position 2c, the conveyance path 2 is covered by a cover member 8 present above the conveyance path 2 and the upper face side of the carrier tape 3 conveyed along the conveyance path 2 is also covered by the cover member 8.

In the conveyance path 2, a first tape conveying part 7A that includes a first sprocket 5A and a first driving mechanism 6A is disposed under the component pickup position 2c. In the conveyance path 2, a second tape conveying part 7B that includes a second sprocket 5B and a second driving mechanism 6B is disposed in the vicinity of the tape inlet 2a on the downstream side thereof. The first sprocket 5A and the second sprocket 5B each include feeding pins on the outer circumference thereof that engage with the holes 3c formed in the base tape 3a.

The first driving mechanism 6A and the second driving mechanism 6B each include a motor that is a driving source, and have a function of transmitting rotations of the motors respectively to the first sprocket 5A and the second sprocket 5B through driving transmitting mechanisms such as gears. The first driving mechanism 6A and the second driving mechanism 6B are controlled by a control part 16, and the first tape conveying part 7A and the second tape conveying part 7B thereby convey the carrier tape 3 along the conveyance path 2. The first tape conveying part 7A and the second tape conveying part 7B therefore constitute a conveying part that conveys the carrier tape 3 along the conveyance path 2.

In this tape conveyance, the second tape conveying part 7B has a function of feeding the carrier tape 3 inserted from the tape inlet 2a to the upstream side and the downstream side along the conveyance path 2. The first tape conveying part 7A has a function of feeding each of the accommodating portions 4 disposed on the lower face side of the base tape 3a to the component pickup position 2c by causing the first sprocket 5A to engage with the base tape 3a of the carrier tape 3 fed from the upstream side.

In the slope portion 2b of the conveyance path 2, a peeling part 9 that includes a pair of rollers 9a and 9b for feeding the tape, and a peeling driving mechanism 10 that drives the peeling part 9 are disposed obliquely under and on the upstream side of the component pickup position 2c. The peeling driving mechanism 10 includes a motor that is a driving source, and has a function of transmitting rotations of the motor to the rollers 9a and 9b through a driving transmitting mechanism such as gears. A peeling operation for the cover tape 3b is executed by the fact that the control part 16 controls the peeling driving mechanism 10 or that the sprocket disposed on the roller 9a is rotated by the carrier tape 3 and the roller 9a is thereby rotated.

Figure 3:
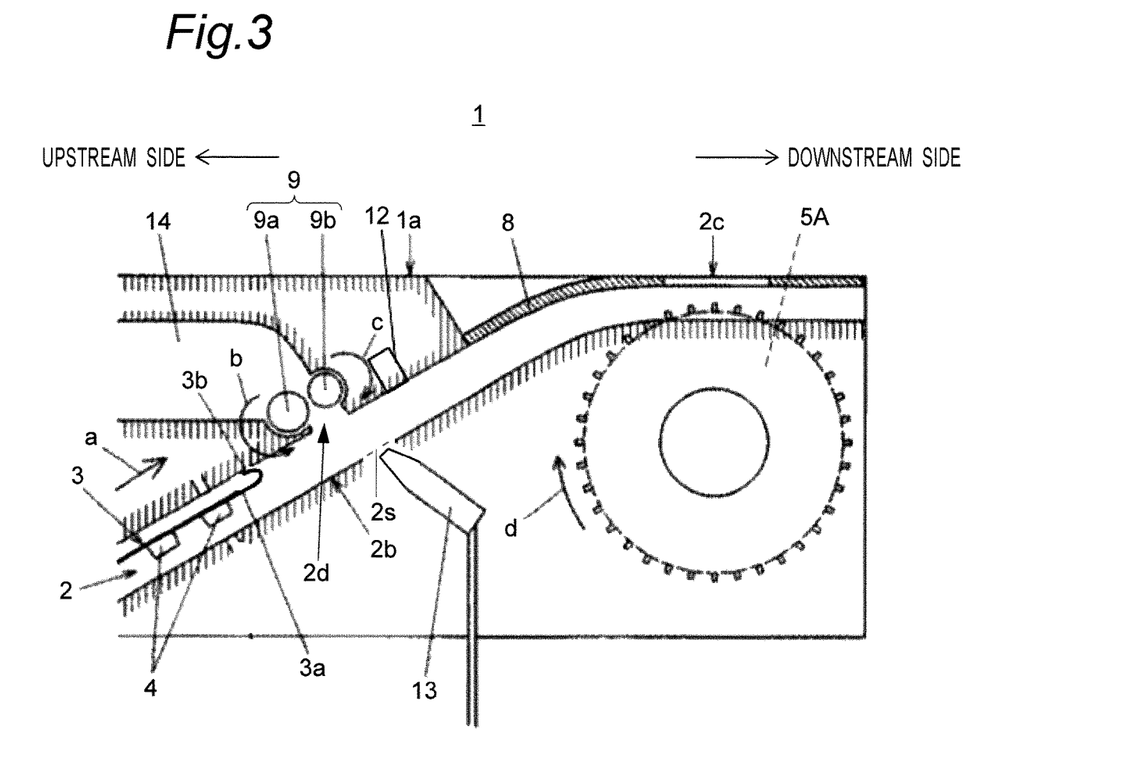
FIG. 3 is an explanatory operation diagram of the component supply device.
Figure 4:
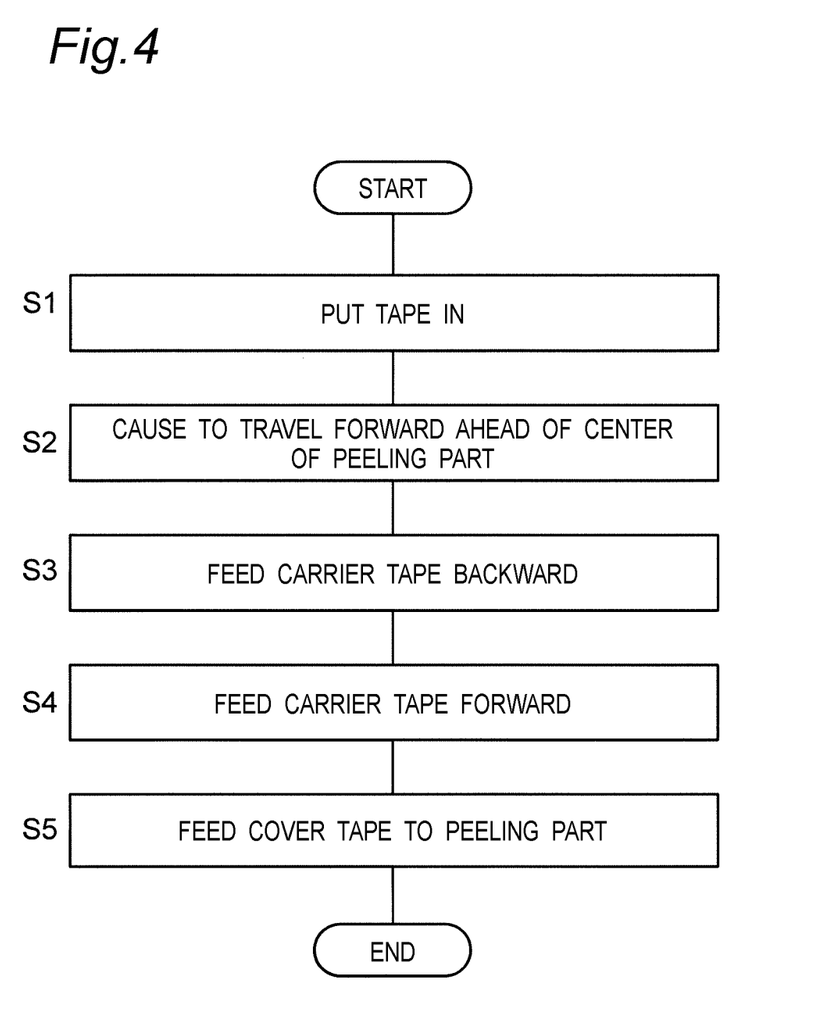
FIG. 4 is a flowchart showing a flow of correcting turning over of a cover tape.

FIG. 1 and FIG. 3 are referred to. The peeling part 9 is disposed, for example, above the conveyance path 2 and communicates with the conveyance path 2 through an opening 2d that opens on the upper face side of the slope portion 2b. The extending portion 3ba of the cover tape 3b of the carrier tape 3 conveyed from the upstream side along the conveyance path 2 passes through the opening 2d, is pulled into the peeling part 9, and is peeled off from the base tape 3a. The carrier tape 3 to be newly set is fed from the tape inlet 2a of the conveyance path 2 in the state where a length to the forward end of the cover tape 3b is longer than that to the forward end 3ab of the base tape 3a (in the state where the cover tape 3b includes the extending portion 3ba). When the forward end portion of the carrier tape 3 arrives at the opening 2d, the extending portion 3ba of the cover tape 3b is captured by the peeling part 9.

The peeling part 9 sandwiches the extending portion 3ba at the forward end of the cover tape 3b between the rollers 9a and 9b, and pulls the extending portion 3ba into the peeling part 9. The cover tape 3b is thereby peeled off from the base tape 3a of the carrier tape 3. The peeled off cover tape 3b is tape-fed in the direction to become distant from the base tape 3a and is accommodated in a cover tape collecting part 14 disposed in the main body 1a. The peeling part 9 and the peeling driving mechanism 10 constitute a tape peeling mechanism 11 that peels off the cover tape 3b from the base tape 3a and that tape-feeds the cover tape 3b. After the cover tape 3b is peeled off from the base tape 3a, the base tape 3a from which the cover tape 3b is peeled off is also referred to "carrier tape 3".

In the slope portion 2b of the conveyance path 2, a tape detecting part 12 is disposed in the downstream of the position at which the peeling part 9 is disposed in the conveyance path 2. The tape detecting part 12 is an optical sensor of a transmission detection type, and detects the forward end portion of the carrier tape 3 conveyed along the conveyance path 2. The result of the detection by the tape detecting part 12 is sent to the control part 16. The forward end portion of the carrier tape 3 can be detected by disposing a dog (a protruding portion) capable of mechanically contacting the forward end portion of the carrier tape 3 and thereby detecting a displacement of the dog occurring when the carrier tape 3 contacts the dog using an optical sensor. With the method of detecting the displacement of the dog, the carrier tape 3 can reliably be detected even in the case where the carrier tape 3 is formed by a light transmissive material.

At a position facing the opening 2d under the slope portion 2b, an air nozzle 13 that sprays air is disposed with an air spraying direction thereof directed to the opening 2d. The air nozzle 13 is a spraying part that sprays air, and the sprayed air passes through a ventilation hole 3s disposed in the conveyance path 2 and is buffeted to the extending portion 3ba of the cover tape 3b positioned in the vicinity of the opening 2d, and the extending portion 3ba of the cover tape 3b is directed toward the peeling part 9 by a force of the sprayed air. The air nozzle 13 functions as an aiding part that aids the peeling part 9 to capture the cover tape 3b, and guides the forward end of the cover tape 3b to the peeling part 9. The air nozzle 13 is connected to a solenoid valve 19 through an air circuit 13a, and air is supplied from an air supplying part 15 to the solenoid valve 19 through an air circuit 15a.

The control part 16 controls the solenoid valve 19 and the air supplied from the air supplying part 15 can thereby be sprayed at an optional timing from the air nozzle 13 toward the peeling part 9. In this embodiment, the control part 16 executes control such that air is sprayed from the air nozzle 13 at the timing at which the turning over of the cover tape 3b is corrected and the extending portion 3ba arrives at the position at which the extending portion 3*ba* can be captured by the peeling part 9. For example, air may be sprayed after a predetermined time period elapses from the time when the tape detecting part 12 detects the forward end of the carrier tape 3. During the predetermined time period, the turning over of the cover tape 3*b* is corrected and the extending portion 3*ba* is moved to a position under the opening 2*d*. Otherwise, when the tape detecting part 12 detects the forward end of the carrier tape 3, air may thereafter be sprayed after the second tape conveying part 7B feeds the carrier tape 3 in a backward direction (to the upstream) by a predetermined distance (for a predetermined time period). The turning over of the cover tape 3*b* is corrected in the time period for the carrier tape 3 to be moved in the backward direction by the predetermined distance, and the extending portion 3*ba* is moved to the position under the opening 2*d*.

The extending portion 3*ba* is pushed against the one roller 9*a* positioned on the downstream side by buffeting the air sprayed by the air nozzle 13 to the extending portion 3*ba*. The roller 9*a* and the roller 9*b* are rotated respectively in directions of arrows b and c shown in FIG. 3, and the extending portion 3*ba* pushed against the roller 9*a* is thereby sandwiched by the one roller 9*a* and the other roller 9*b* to be captured. The cover tape 3*b* is peeled off from the base tape 3*a* by continuing the rotations of the rollers 9*a* and 9*b* and thereby pulling the cover tape 3*b* in a direction to become distant from the base tape 3*a*.

At this time, the spraying direction of the air nozzle 13 is set such that the sprayed air is buffeted to the extending portion 3*ba* from underneath of the carrier tape 3. The air can thereby be buffeted from the direction that is suitable for the purpose of causing the peeling part 9 to capture the extending portion 3*ba*.

In FIG. 1, the control part 16 is communicably connected to each of the first driving mechanism 6A, the second driving mechanism 6B, the peeling driving mechanism 10, the tape detecting part 12, and the solenoid valve 19. The control part 16 controls the tape conveying part and the tape peeling mechanism 11. The control part 16 controls the first driving mechanism 6A and the second driving mechanism 6B, and a tape conveying operation to convey the carrier tape 3 along the conveyance path 2 is thereby executed. At this time, the control part 16 is enabled to control the conveyance timing and the conveyance amount of the carrier tape 3.

The control part 16 controls the peeling driving mechanism 10 and the solenoid valve 19 based on a detection signal by the tape detecting part 12, and such operations are thereby executed as the peeling operation of peeling off the cover tape 3*b* from the base tape 3*a* and a tape feeding operation of feeding the peeled-off cover tape 3*b* into the cover tape collecting part 14. In the peeling operation, the solenoid valve 19 is controlled to cause the air nozzle 13 to spray air therefrom and the cover tape 3*b* is thereby caused to be captured by the peeling part 9.

An operating part 17 is communicably connected to the control part 16, and the control part 16 is further connected to the component mounting device 18 by a communication line. The tape conveying operation and the tape feeding operation described above are executed by an operation order input from the operating part 17 and a control order transmitted from the component mounting device 18.

The tape conveying operation of conveying the carrier tape 3 along the conveyance path 2 in the tape feeder 1 that has the above configuration, and the tape peeling method of peeling off the cover tape 3*b* from the base tape 3*a* of the carrier tape 3 in the tape conveying operation will be described with reference to FIG. 1 to FIG. 6E.

In the tape conveying operation, a tape conveyance step of conveying the carrier tape 3 along the conveyance path 2 to feed a component to the component pickup position 2*c* for picking up by the component mounting mechanism is executed. With the start of the tape conveyance step, tape loading-in of feeding the carrier tape 3 for supplying the component, from the tape inlet 2*a* into the conveyance path 2 is first executed.

The second tape conveying part 7B is started up by the tape loading-in and, as shown in FIG. 3, the load-in carrier tape 3 is tape-fed along the conveyance path 2 to the downstream side (an arrow a). This conveyance causes turning over of the cover tape 3*b*. With this tape conveyance, in the peeling part 9 disposed in the slope portion 2*b*, the rollers 9*a* and 9*b* rotate in directions (arrows b and c) that enable the rollers 9*a* and 9*b* to sandwich therebetween and capture the cover tape 3*b*, and the first sprocket 5A also rotates to be able to tape-convey the carrier tape 3 (an arrow d).

In the course of this tape conveyance, a detection step of detecting the forward end portion of the carrier tape 3 conveyed in the conveyance path 2 by the tape detecting part 12 is executed, and the result of the detection is sent to the control part 16. A correction step of correcting the turning over of the cover tape 3*b* is executed based on the result of the detection. After the turning over of the cover tape 3*b* is corrected, a peeling step of peeling off the cover tape 3*b* from the carrier tape 3 by the peeling part 9 disposed on the upstream side in the conveyance path 2 is executed. With the peeling step, a gas spraying step of spraying air that is a gas to cause the extending portion 3*ba* of the cover tape 3*b* to be captured by the peeling part 9, toward the peeling part 9 by the air nozzle 13 that is the spraying part, is executed.

The control part 16 controls the solenoid valve 19 based on the result of the detection at the detection step and the spraying of the gas at the gas spraying step is thereby executed. The gas spraying step is executed at the timing at which the extending portion 3*ba* (the forward end portion) of the cover tape 3*b* arrives at the position at which the extending portion 3*ba* can be peeled off by the peeling part 9. The air sprayed from the air nozzle 13 is buffeted to the extending portion 3*ba* of the carrier tape 3.

The correction of the turning over of the extending portion 3*ba* (the forward end portion) of the cover tape 3*b* will be described with reference to FIG. 4 to FIG. 6F. The accommodating portions 4 formed on the base tape 3*a* are not shown in FIG. 5A to FIG. 6F.

Figure 5A:
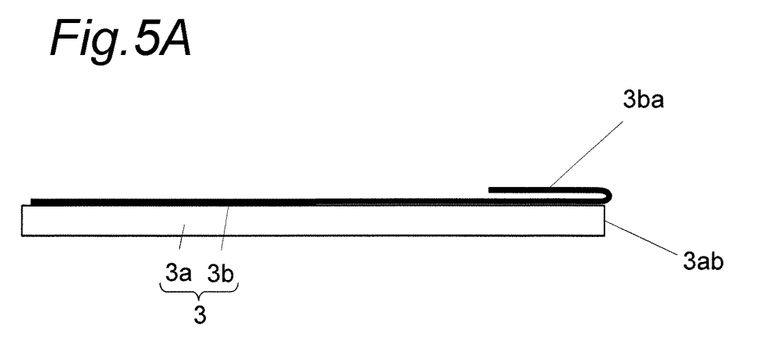
FIG. 5A is an explanatory diagram showing one example of turning over of a cover tape.
Figure 5B:
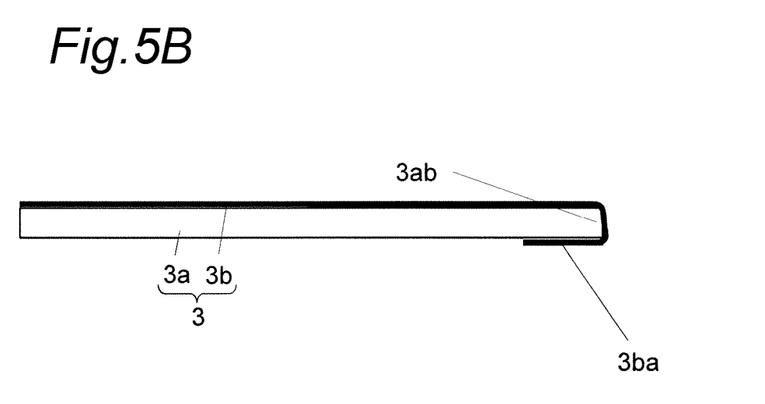
FIG. 5B is an explanatory diagram showing one example of the turning over of a cover tape.

Tape loading-in of feeding the carrier tape 3 from the tape inlet 2*a* into the conveyance path 2 is executed (step S1). The tape loading-in may be executed by a worker or may automatically be executed by an automatic conveying device that conveys the carrier tape 3. At this time, cover tape upward folding for the extending portion 3*ba* that is the portion of the cover tape 3*b* extending from the forward end 3*ab* of the base tape 3*a* to be turned upward on the base tape 3*a* as shown in FIG. 5A, or cover tape downward folding for the extending portion 3*ba* to be turned downward to be beneath the base tape 3*a* as shown in FIG. 5B occurs. Even when the air is sprayed from the air nozzle 13 to the cover tape 3*b* in this state, the extending portion 3*ba* cannot be blown upward and the extending portion 3*ba* of the cover tape 3*b* cannot therefore be guided to the peeling part 9.

Figure 6A:
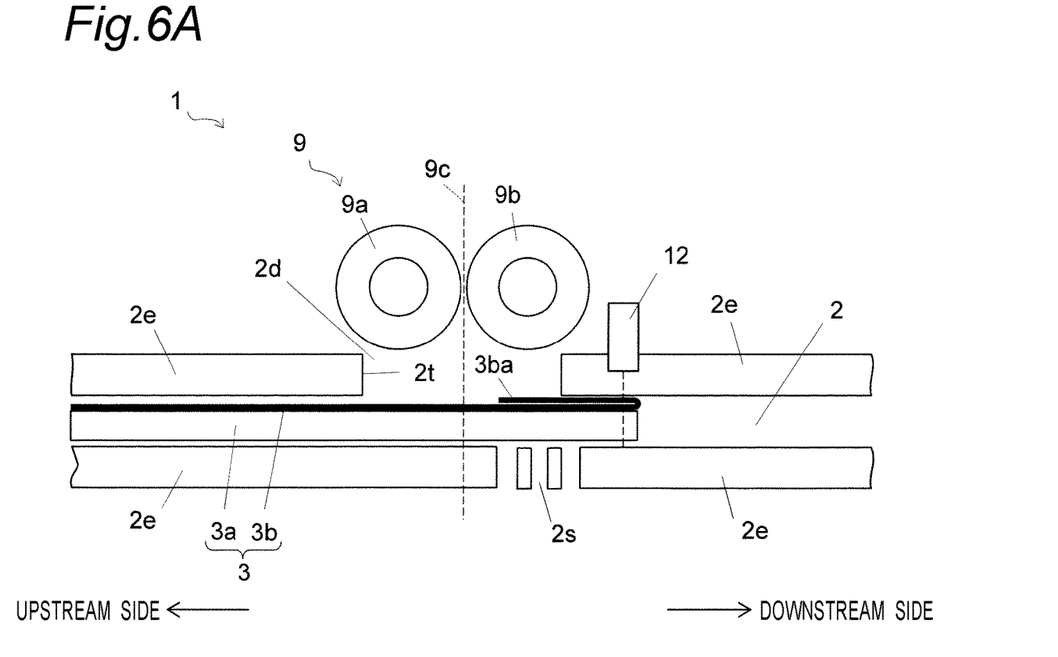
FIG. 6A is an explanatory operation diagram of correction of the turning over of a cover tape.

As shown in FIG. 6A, the second tape conveying part 7B causes the carrier tape 3 to travel forward such that the forward end of the extending portion 3*ba* of the cover tape 3b is positioned on the downstream side of the upstream side of an inner edge of the opening 2d that communicates with the peeling part 9. In this embodiment, the second tape conveying part 7B causes the carrier tape 3 to travel forward to the downstream side of the position of the peeling part 9 in the conveyance path 2 that is a position under a center 9c of the peeling part 9 (step S2). The center 9c of the peeling part 9 is a position located between the rollers 9a and 9b. The control part 16 controls the second tape conveying part 7B to convey the carrier tape 3 until the second tape conveying part 7B receives a signal of detecting the carrier tape 3 from the tape detecting part 12 disposed on the downstream side of the peeling part 9.

When the carrier tape 3 is conveyed and the tape detecting part 12 detects the carrier tape 3, the control part 16 stops the conveyance of the carrier tape 3 based on a signal of this detection and controls the second tape conveying part 7B to feed backward the carrier tape 3, that is, to convey the carrier tape 3 toward the tape inlet 2a (step S3). The motor of the second driving mechanism 6B thereby rotates backward and the second sprocket 5B rotates backward, and the carrier tape 3 travels backward by a predetermined distance in the upstream direction. The predetermined distance by which the carrier tape 3 travels backward is, for example, longer than the length of the extending portion 3ba of the cover tape 3b from the center 9c of the peeling part 9.

Figure 6B:
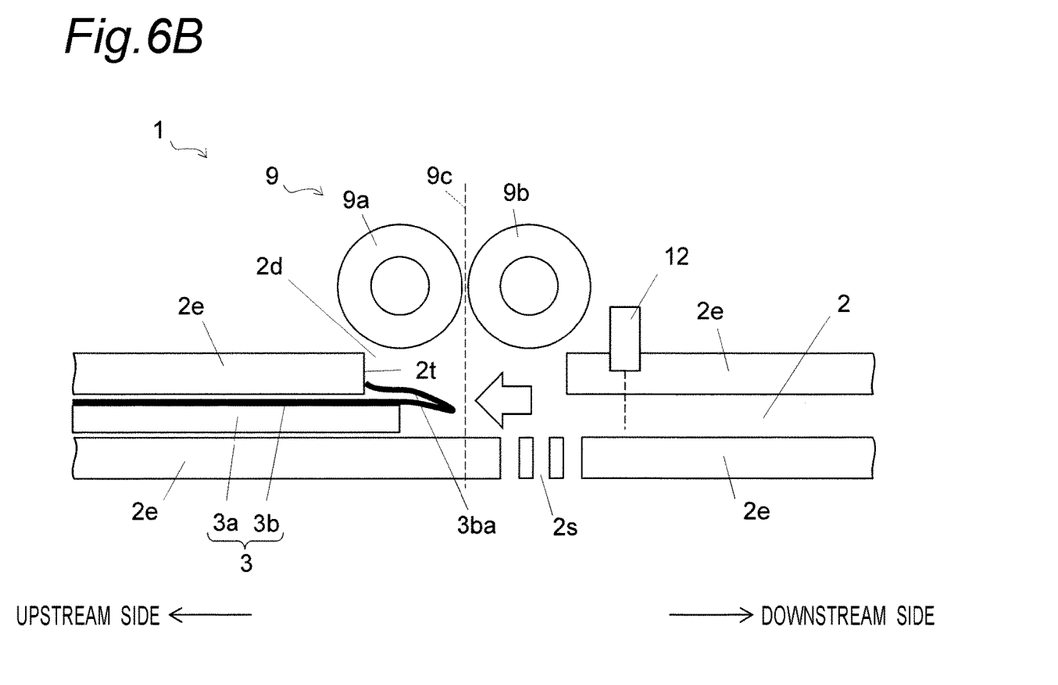
FIG. 6B is an explanatory operation diagram of the correction of the turning over of the cover tape.
Figure 6C:
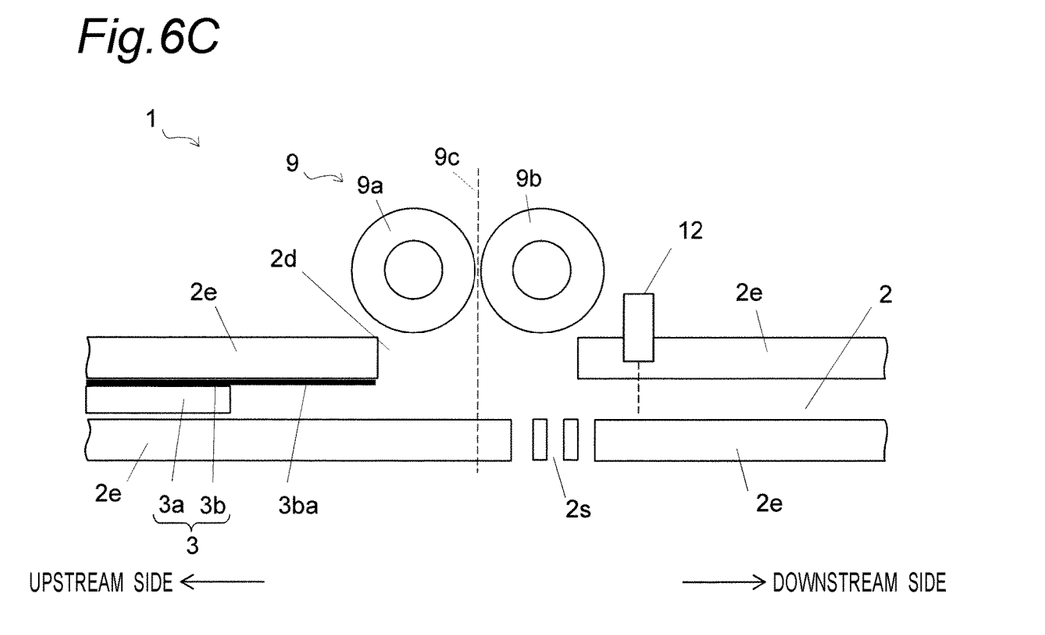
FIG. 6C is an explanatory operation diagram of the correction of the turning over of the cover tape.

As shown in FIG. 6B, when the second tape conveying part 7B feeds backward the carrier tape 3, the turned-over extending portion 3ba of the cover tape 3b contacts an inner edge 2t of the opening 2d. The opening 2d becomes a contact portion and the carrier tape 3 is thereby fed backward with the forward end of the cover tape 3b kept abutted to the opening 2d, and the turning over of the cover tape 3b is therefore corrected and the cover tape 3b is eventually smoothed out into a straight line as shown in FIG. 6C. The carrier tape 3 is fed backward for the predetermined time period based on measurement by a timer from the time when the tape detecting part 12 detects the carrier tape 3 such that the above state is established, and the turning over of the cover tape 3b is thereby corrected.

Figure 6D:
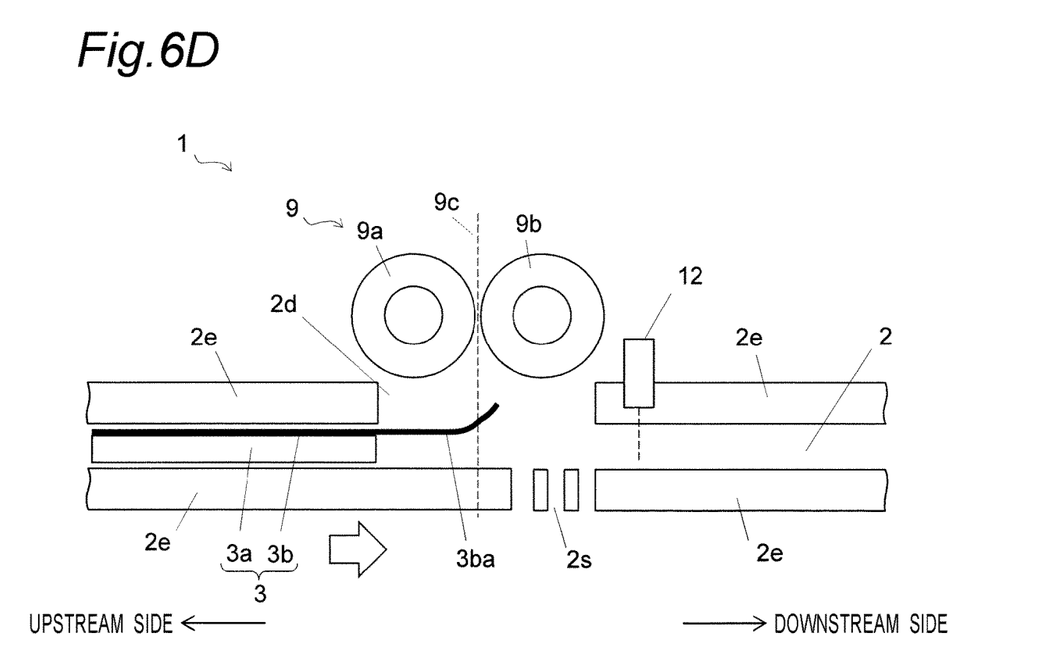
FIG. 6D is an explanatory operation diagram of the correction of the turning over of the cover tape.

After the carrier tape 3 is fed backward for the predetermined time period, when the control part 16 again causes the carrier tape 3 to be conveyed in the forward direction (forward feeding) by a predetermined distance (for a predetermined time period) (step S4), the extending portion 3ba of the cover tape 3b can be positioned together with the forward end of the carrier tape 3 under the center 9c of the peeling part 9, as shown in FIG. 6D.

Figure 6E:
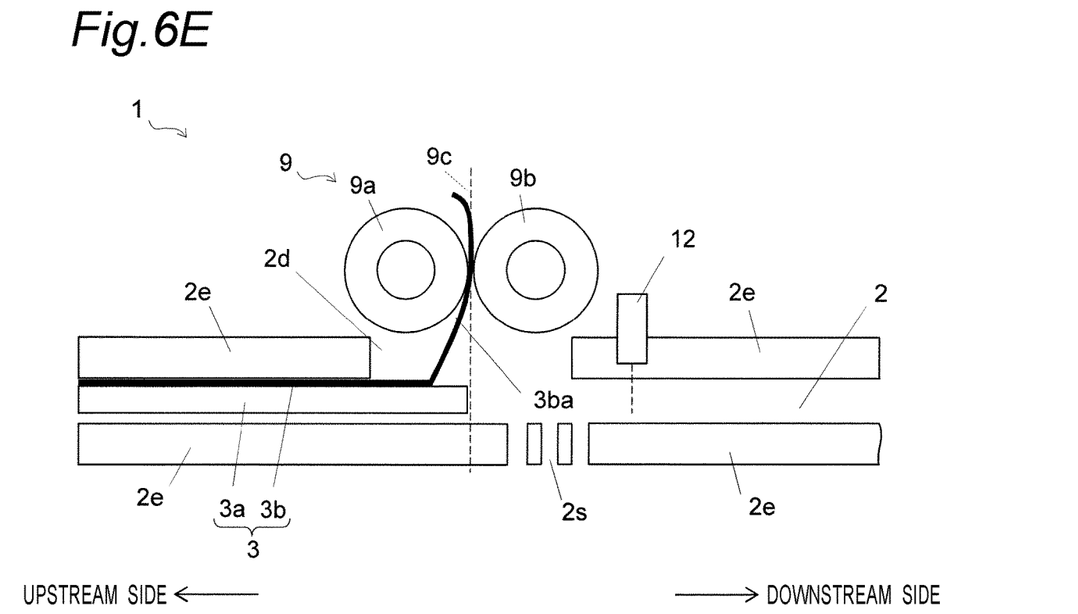
FIG. 6E is an explanatory operation diagram of the correction of the turning over of the cover tape.

The control part 16 causes the air nozzle 13 to spray air therefrom at this timing to blow the forward end of the cover tape 3b to the roller 9a, and feeds the extending portion 3ba of the cover tape 3b to the peeling part 9 (step S5), and the rollers 9a and 9b sandwich the cover tape 3b therebetween and rotate as shown in FIG. 6E. In this manner, the cover tape 3b can be fully automatically peeled off from the base tape 3a.

Figure 6F:
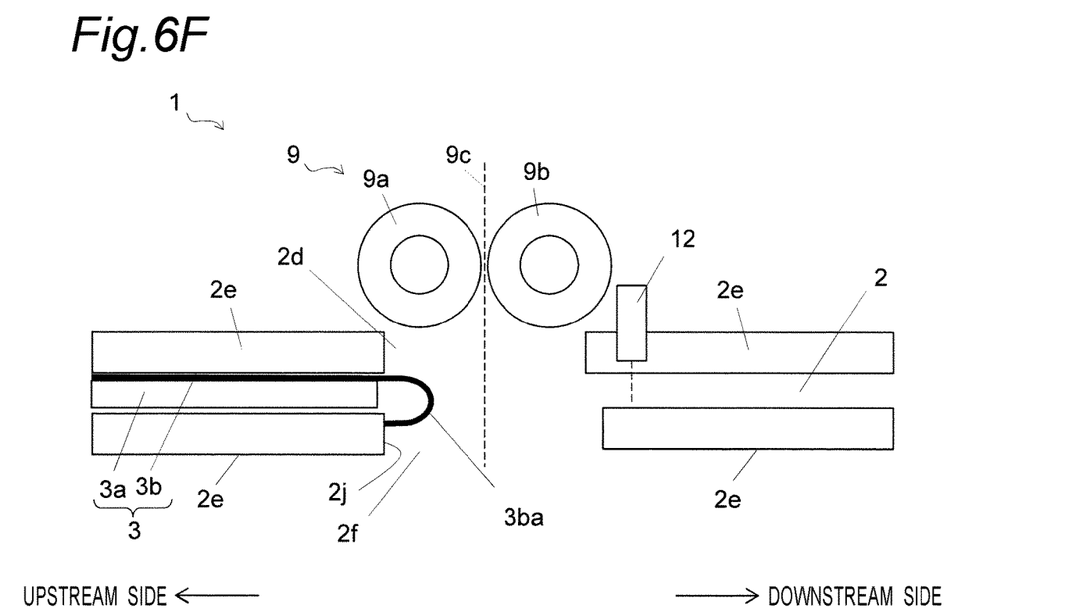
FIG. 6F is an explanatory operation diagram of the correction of the turning over of the cover tape.

The turning over of being folded downward of the cover tape 3b can also be corrected by causing the extending portion 3ba to contact an inner edge 2j of an opening 2f in a similar conveyance operation, by disposing the opening 2f in a pathway wall 2e to face the opening 2d that communicates with the peeling part 9 as shown in FIG. 6F.

With the above correction method for the turning over of the cover tape 3b, the forward end of the cover tape 3b is caused to abut the opening 2d that acts as a contact portion, and the carrier tape 3 is fed backward. The contact portion to which the forward end of the cover tape 3b abuts may be a corner of the pathway wall 2e or may be a groove or a notch formed on the pathway wall 2e instead of the opening 2d.

The turning over of the cover tape 3b can also be corrected only by feeding the carrier tape 3 backward without causing the forward end of the cover tape 3b to abut the contact portion. When the carrier tape 3 is fed backward, air in the conveyance path 2 collides with the extending portion 3ba of the cover tape 3b and the base tape 3a is thereby moved to the upstream side relative to the forward end of the cover tape 3b. In any of the above, in the case where the turning over of the cover tape 3b is corrected by the backward feeding of the carrier tape 3, it is necessary to correct the turning over of the cover tape 3b on the upstream side of the center 9c of the peeling part 9 that captures the forward end of the cover tape 3b.

Instead of conveying the carrier tape 3 backward, a correcting member that corrects the cover tape 3b may move in the conveyance direction relative to the carrier tape 3. As above, either the carrier tape 3 or the correcting member may move, and only has to relatively move.

Figure 7A:
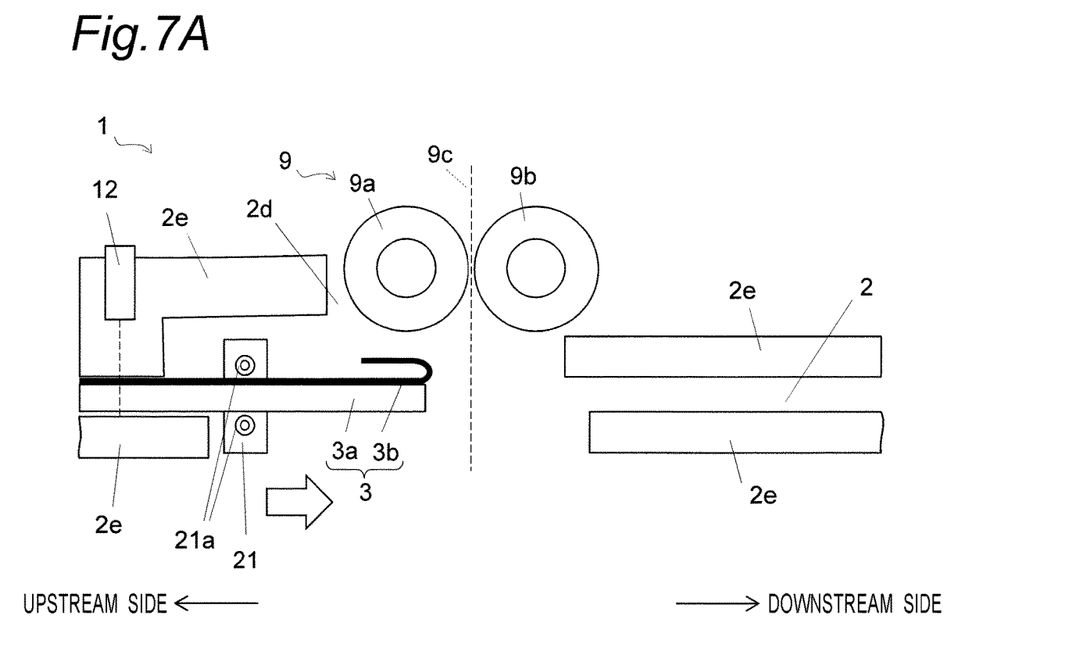
FIG. 7A is an explanatory operation diagram of the correction of the turning over of the cover tape.
Figure 7B:
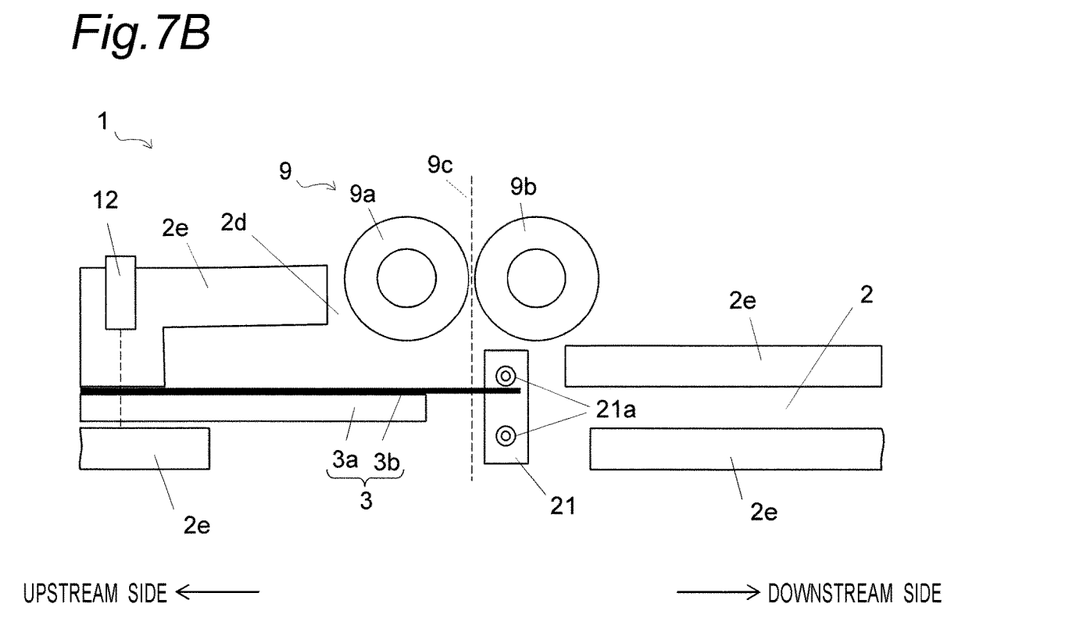
FIG. 7B is an explanatory operation diagram of the correction of the turning over of the cover tape.

For example, as shown in FIG. 7A, the tape feeder 1 may include a roller mechanism 21 that includes a pair of rollers 21a arranged one on another. The roller mechanism 21 is configured to be movable forward and backward in the conveyance direction. The initial position of the roller mechanism 21 and the tape detecting part 12 are located on the upstream side of the peeling part 9. The carrier tape 3 is conveyed through the pair of rollers 21a therebetween. When the tape detecting part 12 detects the carrier tape 3, the control part 16 causes the roller mechanism 21 to move in the forward direction at a velocity higher than the conveyance velocity of the carrier tape 3 after a predetermined time period elapses based on a detection signal by the tape detecting part 12. As shown in FIG. 7B, the roller mechanism 21 causes the pair of rollers 21a to rotate and concurrently moves toward the forward end of the carrier tape 3. The forward end of the cover tape 3b is thereby moved to the downstream side of the base tape 3a, the turning over of the cover tape 3b is corrected, and the extending portion 3ba of the cover tape 3b is smoothed out in a straight line. The control part 16 thereafter returns the roller mechanism 21 to the initial position thereof and causes the air nozzle 13 to spray air therefrom to the extending portion 3ba of the cover tape 3b. The cover tape 3b may be guided to the peeling part 9 in this manner.

Instead of feeding the carrier tape 3 backward with the forward end of the cover tape 3b abutting the contact portion, the carrier tape 3 may be fed backward by a predetermined distance. The turning over is corrected by a frictional force by the cover tape 3b and the pathway wall 2e.

According to the tape feeder 1 of this embodiment, the tape feeder 1 supplies components accommodated in the carrier tape 3 that includes the base tape 3a, and the cover tape 3b that is pasted on the base tape 3a and whose length to the forward end thereof is longer than that of the base tape 3a. The tape feeder 1 includes the second tape conveying part 7B that conveys the carrier tape 3 along the conveyance path 2, a turning over correcting part that moves the forward end of the cover tape 3b folded to the side opposite to that of the conveyance direction, to a position ahead of the forward end 3ab of the base tape 3a in the conveyance direction in the conveyance path 2, and the peeling part 9 that captures the forward end of the cover tape 3b and that peels off the cover tape 3b from the base tape 3a. Even when the cover tape 3b whose length to the forward end thereof is longer than that to the forward end 3ab of the base tape 3a is turned over and is conveyed in this state, the turning over of the cover tape 3*b* can be corrected and a worker therefore does not have to conduct any edge portion processing of partially peeling off the cover tape 3*b* by a predetermined length from the upper face of the carrier tape 3. The tape feeder 1 that saves the labor necessary when the carrier tape 3 is loaded into the tape feeder 1 can therefore be provided.

The turning over correcting part that moves the forward end of the cover tape 3*b* folded to the side opposite to that of the conveyance direction to a position ahead of the forward end 3*ab* of the base tape 3*a* in the conveyance direction may move the forward end of the cover tape 3*b* folded to the side opposite to that of the conveyance direction to a position ahead of the forward end 3*ab* of the base tape 3*a* in the conveyance direction by relative moving of the base tape 3*a* and the cover tape 3*b*. In the case where the roller mechanism 21 is used as the turning over correcting part, the extending portion 3*ba* of the cover tape 3*b* may be smoothed out in the conveyance direction such that the forward end of the cover tape 3*b* is moved in the conveyance direction relative to the forward end 3*ab* of the base tape 3*a*.

The turning over correcting part that moves the forward end of the cover tape 3*b* folded to the side opposite to that of the conveyance direction to a position ahead of the forward end 3*ab* of the base tape 3*a* in the conveyance direction may include the contact portion to which the forward end of the cover tape 3*b* abuts when the carrier tape 3 is conveyed in the backward direction of the conveyance direction.

The contact portion may be the inner edge of the opening 2*d* that is disposed in the conveyance path 2.

The conveyance path 2 may communicate with the peeling part 9 through the opening 2*d*.

The turning over correcting part that moves the forward end of the cover tape 3*b* folded to the side opposite to that of the conveyance direction to a position ahead of the forward end 3*ab* of the base tape 3*a* in the conveyance direction may include the control part 16 that controls the second tape conveying part 7B to convey the carrier tape 3 by a predetermined distance in the backward direction of the conveyance direction to again convey the carrier tape 3 in the conveyance direction.

The tape feeder 1 may include the tape detecting part 12 that detects the carrier tape 3 conveyed along the conveyance path 2 and, based on the result of the detection by the detecting part 12, the control part 16 may control the second tape conveying part 7B to convey the carrier tape 3 by a predetermined distance in the backward direction of the conveyance direction to again convey the carrier tape 3 in the conveyance direction.

The tape feeder 1 may include the air nozzle that guides the forward end of the cover tape 3*b* to the peeling part 9.

The peeling method for the cover tape 3*b* of this embodiment is a peeling method for the cover tape 3*b* of the carrier tape 3 conveyed along the conveyance path 2 in the tape feeder 1, and the carrier tape 3 includes the base tape 3*a* and the cover tape 3*b* that is pasted on the base tape 3*a* and whose length to the forward end thereof is longer than that of the base tape 3*a*. In the peeling method for the cover tape 3*b*, the base tape 3*a* is caused to travel forward in the conveyance direction, the carrier tape 3 after passing through the position of the peeling part 9 that peels off the cover tape 3*b* in the conveyance path 2 is caused to travel backward by a predetermined distance, the carrier tape 3*a* caused to travel backward is caused to again travel forward, the forward end of the cover tape 3*b* is captured by the peeling part 9, and the cover tape 3*b* is thereby peeled off from the base tape 3*a*.

The carrier tape 3 may be caused to travel backward in the state where the forward end of the cover tape 3*b* abuts the contact portion.

The tape detecting part 12 may detect the forward end of the carrier tape 3 and, based on the result of the detection of the forward end of the carrier tape 3, the carrier tape 3 after passing through the position of the peeling part 9 in the conveyance path 2 may be caused to travel backward by a predetermined distance.

Air may be sprayed toward the peeling part 9 and to the forward end of the cover tape 3*b* after being caused to again travel forward.

The present invention has been described with reference to the above embodiment and the present invention is, however, not limited to the above embodiment.

In the above embodiment, air is sprayed from the air nozzle 13 to direct the extending portion 3*ba* of the cover tape 3*b* toward the peeling part 9, and the configuration is, however, not limited to this. Instead of spraying air, a bar to contact the extending portion 3*ba* of the cover tape 3*b* may be moved to guide the extending portion 3*ba* of the cover tape 3*b* to the peeling part 9. The aid by the air nozzle 13 for the capture may not be executed.

In the above embodiment, the control part 16 controls the second tape conveying part 7B to cause the carrier tape 3 to travel backward based on the detection signal by the tape detecting part 12 and the configuration is, however, not limited to this. The timing at which the carrier tape 3 is caused to travel backward may be determined by, for example, the following method. A standard time period from the time when the forward end of the carrier tape 3 is loaded into the tape inlet 2*a* of the tape feeder 1 to the time when this forward end arrives at a position on the downstream side of the position of the peeling part 9 in the conveyance path 2 is measured in advance. When the forward end of the carrier tape 3 is loaded into the tape inlet 2*a*, a timer measures the conveyance time period and, at the timing at which the conveyance time period becomes equal to the standard time period, the control part 16 may control the second tape conveying part 7B to cause the carrier tape 3 to travel backward.

The present invention is applicable to any component supply device that conveys a carrier tape.

EXPLANATIONS OF LETTERS OR NUMBERS 1 tape feeder
1*a* main body
1*ab* side end face
1*ac* side end face
2 conveyance path
2*a* tape inlet
2*b* slope portion
2*c* component pickup position
2*d* opening
2*e* pathway wall
2*f* opening
2*j* inner edge
2*t* inner edge
2*s* ventilation hole
3 carrier tape
3*a* base tape
3*aa* side edge portion
3*ab* forward end 3b cover tape
3ba extending portion
4 accommodating portion
5B second sprocket
6B second driving mechanism
7A first tape conveying part
7B second tape conveying part
9 peeling part
9a roller
9b roller
9c center
12 tape detecting part
13 air nozzle
14 cover tape collecting part
16 control part
21 roller mechanism
21a rollers

What is claimed is:

1. A component supply device that supplies a component accommodated in a carrier tape comprising a base tape and a cover tape pasted on the base tape and having a length to a forward end thereof that is longer than that of the base tape, the component supply device comprising:
    a tape conveying part that conveys the carrier tape along a conveyance path;
    a turning over correcting part that moves the forward end of the cover tape folded to a side opposite to a side of a conveyance direction, to a position located ahead of a forward end of the base tape in the conveyance direction in the conveyance path; and
    a peeling part that captures the forward end of the cover tape, the peeling part peeling off the cover tape from the base tape.

2. The component supply device according to claim 1, wherein
    the turning over correcting part moves the forward end of the cover tape folded to the side opposite to the side of the conveyance direction, to a position located ahead of the forward end of the base tape in the conveyance direction by relative moving of the base tape and the forward end of the cover tape.

3. The component supply device according to claim 2, wherein
    the turning over correcting part comprises
    a conveyance control part that controls the tape conveying part to convey the carrier tape by a predetermined distance in a backward direction of the conveyance direction.

4. The component supply device according to claim 3, wherein
    the component supply device comprises
    a tape detecting part that detects the carrier tape conveyed along the conveyance path, and wherein
    the conveyance control part controls the tape conveying part, based on a result of detection by the tape detecting part, to convey the carrier tape by a predetermined distance in the backward direction of the conveyance direction.

5. The component supply device according to claim 1, wherein
    the component supply device comprises
    an air nozzle that guides the forward end of the cover tape to the peeling part.

6. The component supply device according to claim 1, wherein
    the turning over correcting part comprises
    a contact portion to which the forward end of the cover tape abuts when the carrier tape is conveyed in a backward direction of the conveyance direction.

7. The component supply device according to claim 6, wherein
    the turning over correcting part comprises
    a conveyance control part that controls the tape conveying part to convey the carrier tape by a predetermined distance in the backward direction of the conveyance direction.

8. The component supply device according to claim 6, wherein
    the contact portion is an inner edge of an opening that is disposed in the conveyance path.

9. The component supply device according to claim 4, wherein
    the turning over correcting part comprises
    a conveyance control part that controls the tape conveying part to convey the carrier tape by a predetermined distance in the backward direction of the conveyance direction.

10. The component supply device according to claim 8, wherein
    the conveyance path communicates with the peeling part through the opening.

11. The component supply device according to claim 10, wherein
    the turning over correcting part comprises
    a conveyance control part that controls the tape conveying part to convey the carrier tape by a predetermined distance in the backward direction of the conveyance direction.

* * * * *